United States Patent
Sander et al.

(10) Patent No.: US 10,950,509 B2
(45) Date of Patent: Mar. 16, 2021

(54) SEMICONDUCTOR DEVICE WITH INTEGRATED SHUNT RESISTOR

(71) Applicant: Infineon Technologies AG, Neubiberg (DE)

(72) Inventors: Rainald Sander, Oberhaching (DE); Thomas Bemmerl, Schwandorf (DE); Steffen Thiele, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/399,603

(22) Filed: Apr. 30, 2019

(65) Prior Publication Data

US 2019/0348333 A1      Nov. 14, 2019

(30) Foreign Application Priority Data

May 9, 2018   (DE) .......................... 102018207308.2

(51) Int. Cl.
*H01L 27/092*     (2006.01)
*H01L 29/06*      (2006.01)
(Continued)

(52) U.S. Cl.
CPC .......... *H01L 22/34* (2013.01); *H01L 21/4825* (2013.01); *H01L 23/4952* (2013.01); *H01L 23/49503* (2013.01); *H01L 23/49524* (2013.01); *H01L 23/49562* (2013.01); *H01L 23/49575* (2013.01); *H01L 27/0924* (2013.01);
(Continued)

(58) Field of Classification Search
CPC ............. H01L 27/0924; H01L 29/0653; H01L 29/0665; H01L 2224/34; H01L 2224/40247; H01L 2224/72; H01L 2224/73227; H01L 2224/73221; H01L 2224/73229; H01L 2224/73271; H01L 2224/73279
See application file for complete search history.

(56) References Cited

U.S. PATENT DOCUMENTS

| 7,476,816 | B2 * | 1/2009 | Doogue | ................... G01R 1/36 174/528 |
| 7,598,601 | B2 * | 10/2009 | Taylor | ................. G01R 15/207 174/536 |

(Continued)

FOREIGN PATENT DOCUMENTS

| DE | 102013101857 A1 | 8/2013 |
| DE | 102013213348 A1 | 1/2015 |

(Continued)

OTHER PUBLICATIONS

Office Action, in the German language, from counterpart German Application No. 102018207308.2, dated May 24, 2019, 6 pp.

(Continued)

*Primary Examiner* — Ida M Soward
(74) *Attorney, Agent, or Firm* — Shumaker & Sieffert, P.A.

(57) ABSTRACT

A semiconductor device includes a first chip pad, a power semiconductor chip arranged on the first chip pad and including at least a first and a second power electrode, and a clip connected to the first power electrode. In this case, an integral part of the clip forms a shunt resistor and a first contact finger of the shunt resistor is embodied integrally with the clip.

13 Claims, 6 Drawing Sheets

(51) Int. Cl.
  *H01L 21/66* (2006.01)
  *H01L 23/495* (2006.01)
  *H01L 21/48* (2006.01)

(52) U.S. Cl.
  CPC ...... *H01L 29/0653* (2013.01); *H01L 29/0665* (2013.01); *H01L 2224/34* (2013.01); *H01L 2224/40247* (2013.01); *H01L 2224/72* (2013.01); *H01L 2224/73221* (2013.01); *H01L 2224/73227* (2013.01); *H01L 2224/73229* (2013.01); *H01L 2224/73271* (2013.01); *H01L 2224/73279* (2013.01)

(56) References Cited

U.S. PATENT DOCUMENTS

| | | | |
|---|---|---|---|
| 8,669,650 B2 * | 3/2014 | Zhang | H01L 23/49524 257/676 |
| 8,912,640 B2 * | 12/2014 | Takada | H01L 23/49513 257/687 |
| 9,006,883 B2 | 4/2015 | Fujita et al. | |
| 9,123,711 B2 * | 9/2015 | Fujita | H01L 23/4952 |
| 9,196,561 B2 * | 11/2015 | Fujita | H01L 24/37 |
| 9,490,200 B2 * | 11/2016 | Yoshihara | H01L 23/645 |
| 9,559,068 B2 * | 1/2017 | Hauenstein | H01L 25/16 |
| 9,564,423 B2 * | 2/2017 | Chen | H01L 23/62 |
| 9,711,436 B2 * | 7/2017 | Gehrke | H01L 24/41 |
| 10,168,391 B2 * | 1/2019 | Babulano | G01R 33/0047 |
| 10,224,912 B2 | 3/2019 | Otremba et al. | |
| 2004/0155645 A1 | 8/2004 | Dragoi et al. | |
| 2006/0181263 A1 | 8/2006 | Doogue et al. | |
| 2007/0176626 A1 | 8/2007 | Bayerer et al. | |
| 2009/0191665 A1 * | 7/2009 | Nikitin | H01L 23/5389 438/107 |
| 2012/0181996 A1 | 7/2012 | Gehrke | |
| 2012/0200281 A1 * | 8/2012 | Herbsommer | H01L 23/49575 323/311 |
| 2013/0140602 A1 | 6/2013 | Chang | |
| 2013/0278328 A1 | 10/2013 | Denison et al. | |
| 2014/0131843 A1 * | 5/2014 | Balakrishnan | H01L 23/49541 257/666 |
| 2016/0380181 A1 * | 12/2016 | Meyer | H01L 43/02 324/252 |
| 2018/0083613 A1 * | 3/2018 | Nakajima | H01L 23/49575 |
| 2018/0123431 A1 * | 5/2018 | Kawaguchi | H01L 25/18 |
| 2019/0035745 A1 * | 1/2019 | Muto | H01L 23/49531 |
| 2019/0221549 A1 * | 7/2019 | Hayashi | H01L 23/49575 |
| 2019/0326131 A1 * | 10/2019 | Chien | H01L 21/4825 |
| 2020/0219838 A1 * | 7/2020 | Salzman | H01L 24/73 |

FOREIGN PATENT DOCUMENTS

| | | |
|---|---|---|
| DE | 102016106113 A1 | 10/2017 |
| WO | 2012076407 A1 | 6/2012 |

OTHER PUBLICATIONS

Office Action, in the German language, from counterpart German Application No. 102018207308.2, dated Dec. 10, 2018, 6 pp.

* cited by examiner

SEMICONDUCTOR DEVICE WITH INTEGRATED SHUNT RESISTOR

This Application claims priority to German Application Number 102018207308.2, filed on May 9, 2018, the entire content of which is incorporated herein by reference.

TECHNICAL FIELD

The present disclosure relates to a semiconductor device with integrated shunt resistor, and to a method for producing a semiconductor device with integrated shunt resistor.

BACKGROUND

Semiconductor devices can contain power semiconductor chips configured to switch high currents. For numerous applications it may be necessary to determine the intensity of a current flowing through such a power semiconductor chip. Such a determination of the current flow can usually take place externally; by way of example, the semiconductor device can be fitted on a circuit board and be electrically connected to the latter and a measuring device for measuring the current through the power semiconductor chip may be present on the circuit board. For the purpose of an optimized integration density of the semiconductor device, however, it may be advantageous to determine the current internally, i.e. within the semiconductor device itself, e.g. by means of an integrated shunt resistor.

An object of the invention can therefore be considered that of providing a semiconductor device with an improved integrated shunt resistor. Furthermore, the invention aims to specify a method for producing a semiconductor device with an improved integrated shunt resistor.

This object is achieved by means of the features of the independent claims. The dependent claims present advantageous configurations of the disclosure.

SUMMARY

One aspect of the disclosure relates to a semiconductor device, comprising a first chip pad, a power semiconductor chip arranged on the first chip pad and comprising at least a first and a second power electrode, and a clip connected to the first power electrode, wherein an integral part of the clip forms a shunt resistor, and wherein a first contact finger of the shunt resistor is embodied integrally with the clip.

A further aspect of the disclosure relates to a method for producing a semiconductor device, the method comprising fitting a power semiconductor chip on a chip pad, wherein the power semiconductor chip comprises at least a first and a second power electrode, and fitting a clip to the first power electrode, wherein an integral part of the clip forms a shunt resistor and wherein a first contact finger of the shunt resistor is embodied integrally with the clip.

BRIEF DESCRIPTION OF THE DRAWINGS

A semiconductor device and a method for producing a semiconductor device in accordance with the disclosure are explained in greater detail below with reference to drawings.

The elements shown in the drawings are not necessarily rendered in a manner true to scale relative to one another. Identical reference signs may denote identical components.

DETAILED DESCRIPTION

In the following detailed description, reference is made to the drawings and the examples shown therein. The terms "fit", "secure" and "connect" together with derivatives thereof may be used. These terms may be used to indicate that two elements cooperate or interact with one another, it being unimportant whether they are in direct physical or electrical contact with one another or are not in direct contact with one another; intermediate elements or layers may be provided between the "fitted", "secured" or "connected" elements or the elements may have direct contact with one another.

Figure 1:
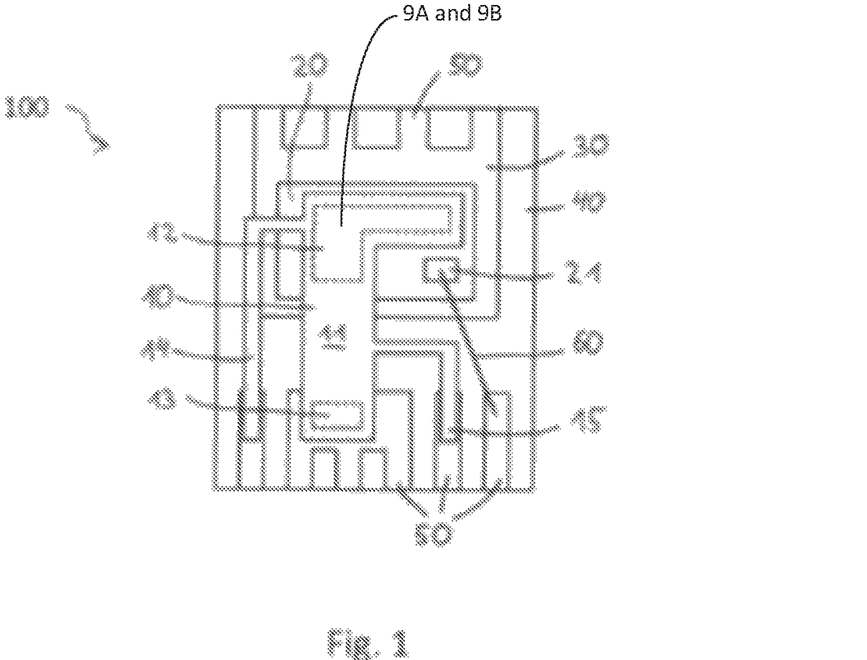
FIG. 1 shows a schematic plan view of a semiconductor device with integrated shunt resistor in accordance with the disclosure.

FIG. 1 shows one example of a semiconductor device 100 comprising a clip 10, a power semiconductor chip 20 and a chip pad 30. The power semiconductor chip 20 comprises at least a first and a second power electrode 9A and 9B, wherein the clip 10 is electrically connected to the first power electrode 9A. The semiconductor device 100 may furthermore comprise an encapsulation 40 and external terminals 50 exposed at the encapsulation 40. The clip 10 can be completely encapsulated by the encapsulation 40.

The semiconductor device 100 can be designed for customer-side fitting to a circuit board, e.g. as a surface mounted device or as a through hole device. The semiconductor device 100 can be a semiconductor package. The encapsulation 40 can be an injection-molded body or a laminated body. The external terminals 50 can, as shown in FIGS. 1 and 3A to 6, be embodied such that they do not project beyond an outline contour of the encapsulation (no leads package), or they can project beyond the outline contour (leaded package).

In accordance with one example, the first power electrode 9A is arranged on an upper main surface of the power semiconductor chip 20 and the second power electrode 9B is arranged on an opposite lower main surface of the power semiconductor chip 20, i.e. the power semiconductor chip 20 is designed for a vertical current flow. The second power electrode 9B can be electrically connected to the chip pad 30. In accordance with one example, the first power electrode 9A can be a source electrode and the second power electrode 9B can be a drain electrode. In accordance with a further example, source and drain electrodes can be interchanged.

The power semiconductor chip 20 can comprise a control electrode 21, e.g. a gate electrode, which is configured to control a current flow between the power electrodes 9A and 9B. The control electrode 21 can be arranged on the upper main surface of the power semiconductor chip 20. The control electrode can be connected to an external terminal 50 of the semiconductor device 100 by an electrical connector 60. The electrical connector 60 can comprise or consist of a bond wire or a clip.

The clip 10 can be configured to electrically connect the first power electrode 9A of the semiconductor chip 20 to a further element of the semiconductor device 100, e.g. to an external terminal 50 or a further chip pad (not shown in FIG. 1). The clip 10 can comprise or consist of an arbitrary electrically conductive material, e.g. a metal or a metal alloy. The clip 10 can comprise or consist of Al, Cu or Fe, for example. The clip 10 can be embodied in one piece, i.e. from a single continuous piece.

The clip 10 comprises an integral part 11 forming a shunt resistor or measuring resistor. The shunt resistor is designed to the effect that a current flow through the clip 10 can be measured by way of the voltage drop across the shunt resistor, which is proportional to the current flow.

The integral part 11 can be arranged between a first contact area 12 and a second contact area 13 of the clip 10, which can be situated at opposite ends of the clip 10. At the first contact area 12, the clip 10 is connected to the first power electrode 9A of the power semiconductor chip 20, e.g. is soldered onto said first power electrode 9A. At the second contact area 13, the clip 10 can be connected to an external terminal 50 or to a further chip pad of the semiconductor device 100. Alternatively, the clip 10 can also itself form an external terminal 50 of the semiconductor device 100; in this case, a second contact area 13 is not present.

The clip 10 comprises at least a first contact finger 14 of the shunt resistor, wherein the first contact finger 14 is embodied integrally (in one piece) with the clip 10. The first contact finger 14 can project e.g. laterally from the rest of the clip 10. A distal end of the first contact finger 14 can be connected to an external terminal 50 of the semiconductor device 100 or form an external terminal 50.

In accordance with one example, the clip 10 can furthermore comprise a second contact finger 15 of the shunt resistor, wherein the second contact finger 15 is embodied integrally (in one piece) with the clip 10. A distal end of the second contact finger 15 can be connected to an external terminal 50 of the semiconductor device 100 or form an external terminal 50.

In accordance with one example, a current flow through the clip 10 can be measured in such a way that the voltage drop across the shunt resistor that is associated with the current flow is tapped off and measured at the contact fingers 14 and 15. In accordance with another example, for instance if the clip comprises only the first contact finger 14 but not the second contact finger 15, the current flow can also be measured in such a way that the voltage drop across the shunt resistor is tapped off and measured at the contact finger 14 and at that external terminal 50 to which the second contact area 13 of the clip 10 is connected.

The clip 10 can be configured in such a way that the integral part 11 comprises a shunt resistor having a resistor value such that a current flow through the clip 10 can be measured with the application-specifically desired accuracy. For example, the length and/or the thickness and/or the width of the clip 10 can be chosen in such a way that the shunt resistor formed by the integral part 11 has the resistance value required for the desired accuracy. In accordance with one example, a voltage drop across the shunt resistor can be approximately 1 mV.

Figure 2:
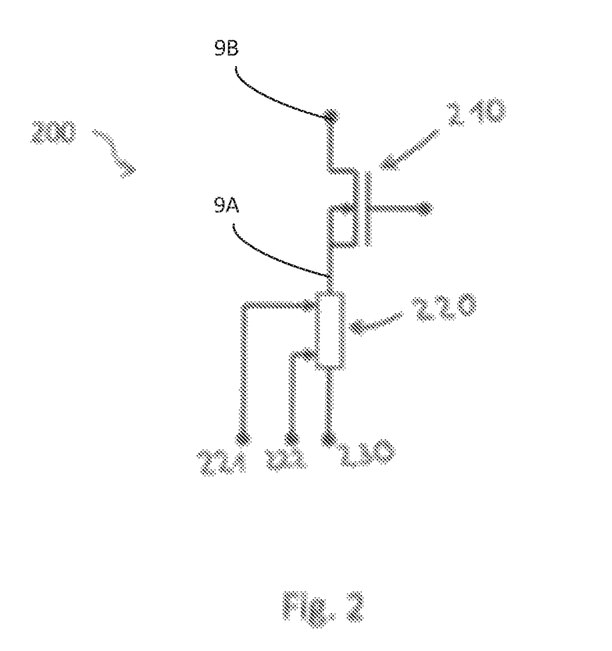
FIG. 2 shows a circuit diagram which can be realized e.g. by the semiconductor device from FIG. 1.

FIG. 2 shows an electrical circuit diagram 200 representing one possible electrical circuit of the semiconductor device 100. The circuit diagram 200 comprises a transistor 210 and a shunt resistor 220 connected to a first power electrode 9A of the transistor, e.g. a source electrode. The shunt resistor 220 comprises measurement contacts 221, 222 in order to be able to determine a voltage drop across the shunt resistor 220 and thus a current flow through the transistor 210. In the semiconductor device 100, the transistor 210 can be realized by the power semiconductor chip 20, the shunt resistor 220 can be realized by the integral part 11 of the clip 10, and the measurement contacts 221, 222 can be realized by the contact fingers 14, 15. Alternatively, in the case where only the first measurement contact 221 (i.e. the first contact finger 14) is present, but not the second measurement contact 222 (i.e. the second contact finger 15), a power contact 230, e.g. a source contact, of the transistor 210, said power contact corresponding to the external terminal 50, can simultaneously function as a second measurement contact of the shunt resistor 220.

The subsequent FIGS. 3A to 6 show further examples of semiconductor devices, which can be identical to the semiconductor device 100 apart from the differences shown or described. In particular, what all of the semiconductor devices in accordance with the disclosure have in common is that an integral part of the clip 10 forms a shunt resistor, the shunt resistor comprises at least one contact finger and the at least one contact finger is embodied integrally with the clip 10. Identical reference signs may denote identical components.

Figure 3A:
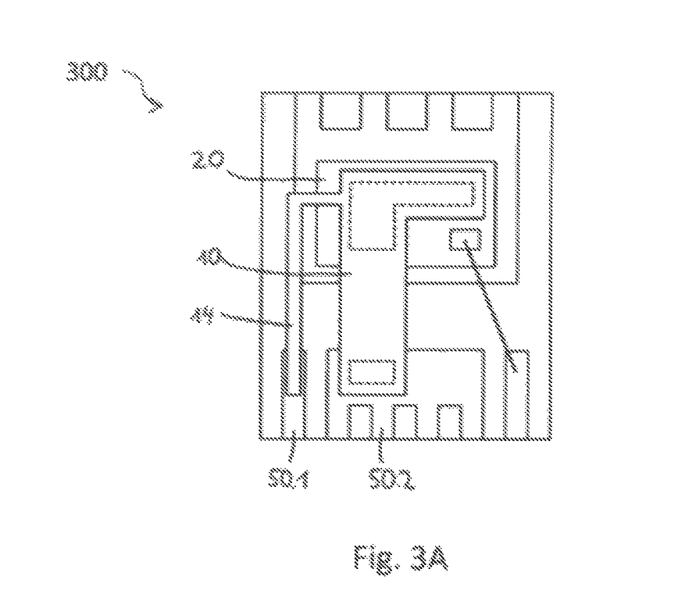
FIGS. 3A-3C show schematic plan views of further semiconductor devices in accordance with the disclosure, in which one or a plurality of contact fingers of the integrated shunt resistor have different arrangements.
Figure 3B:
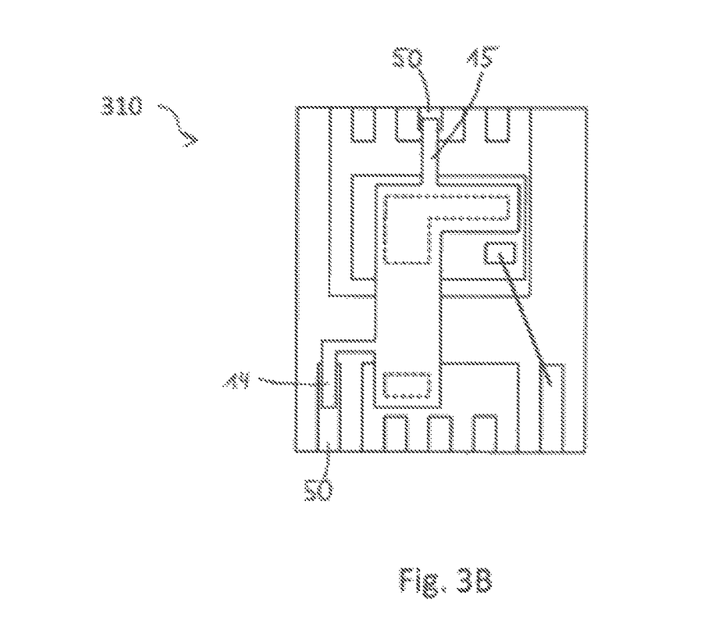
Figure 3C:
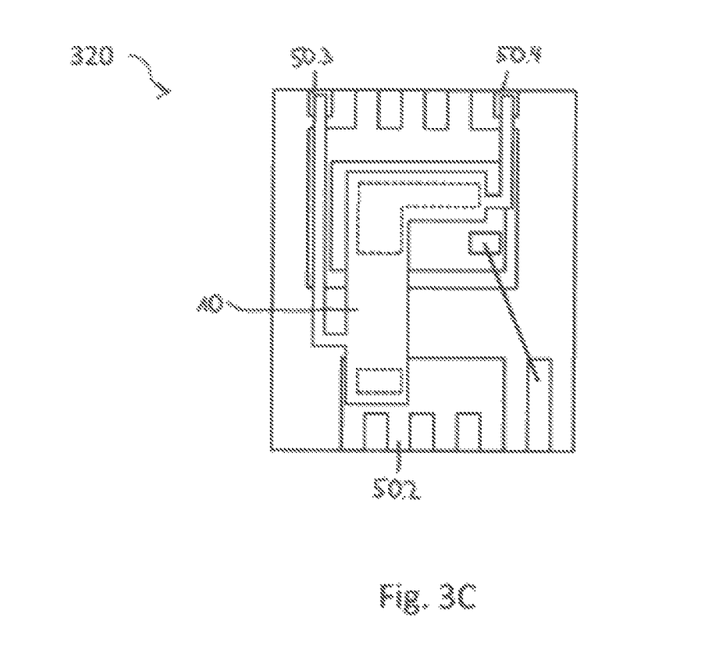

FIGS. 3A to 3C show various possibilities for connecting contact fingers of the shunt resistor to external terminals of the semiconductor device.

FIG. 3A shows a semiconductor device 300 in which the shunt resistor comprises only a single contact finger 14. A distal end of the contact finger 14 is connected to a first external terminal 50.1 of the semiconductor device 300. A distal end of the clip 10 is connected to a second external terminal 50.2, wherein the second terminal 50.2 forms a common power terminal of the power semiconductor chip 20 and measurement terminal for measuring a voltage drop across the shunt resistor.

FIG. 3B shows a semiconductor device 310 in which the shunt resistor comprises two contact fingers 14, 15. The contact fingers 14, 15 are connected to external terminals 50 lying on opposite sides of the semiconductor device.

FIG. 3C likewise shows a semiconductor device 320 in which the shunt resistor comprises two contact fingers 14, 15. One end of the clip 10 is connected to an external terminal 50.2 of the semiconductor device 320. The contact fingers 14, 15 are connected to external terminals 50.3, 50.4 arranged on a side of the semiconductor device 320 that is situated opposite the side having the external terminal 50.2.

FIGS. 1 and 3A to 3C show semiconductor devices in which the contact finger 14 or respectively the contact fingers 14, 15 is/are connected to external terminals of the semiconductor device. That means that in the exemplary semiconductor devices in FIGS. 1 and 3A to 3C, the voltage drop across the shunt resistor and thus the current flow through the clip 10 is measured externally. In accordance with a further aspect of the disclosure, however, it is also possible for this measurement to take place internally. For this purpose, a semiconductor voltage measuring unit can be arranged in the semiconductor device and the contact fingers 14, 15 can be connected to the semiconductor voltage measuring unit.

Figure 4A:
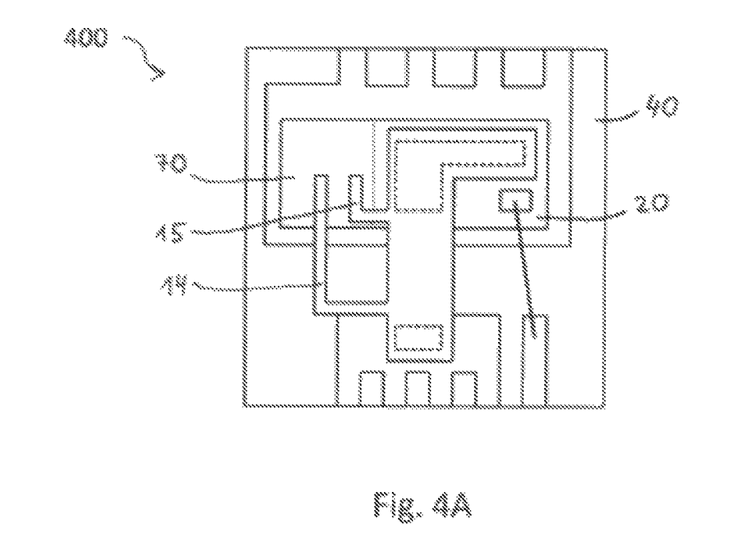
FIGS. 4A-4C show schematic plan views of further semiconductor devices in accordance with the disclosure, which furthermore comprise an integrated semiconductor voltage measuring unit, which is electrically connected to the contact fingers of the integrated shunt resistor.
Figure 4B:
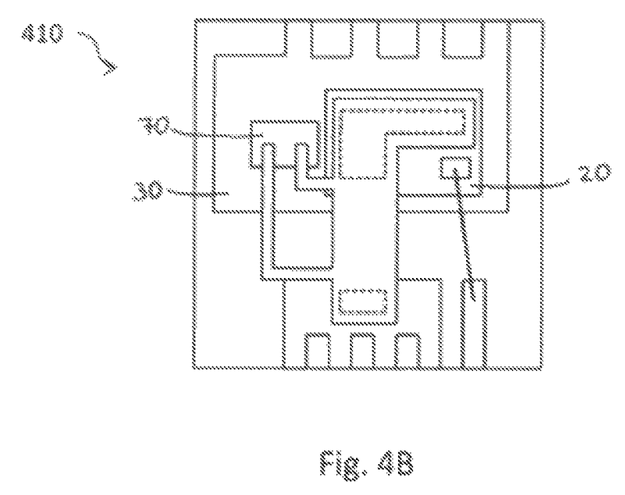
Figure 4C:
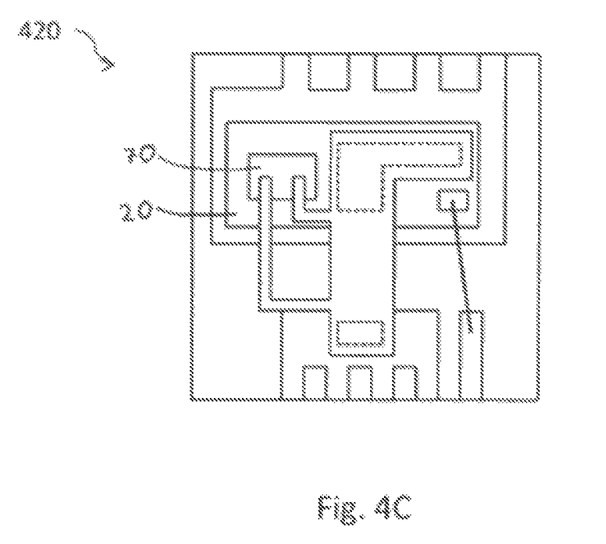

FIGS. 4A to 4C show examples of semiconductor devices comprising an integrated semiconductor voltage measuring unit 70. In accordance with one example, the semiconductor voltage measuring unit 70 can be connected to external terminals of the semiconductor device (not shown in FIG. 4), e.g. in order to communicate the measured voltage drop. The semiconductor voltage measuring unit 70 can be completely encapsulated by the encapsulation 40.

In accordance with one example, the semiconductor voltage measuring unit 70 can comprise a logic semiconductor component. The semiconductor voltage measuring unit 70 can comprise a bipolar transistor. The semiconductor voltage measuring unit 70 can be realized by CMOS technology.

FIG. 4A shows a semiconductor device 400 in which the semiconductor voltage measuring unit 70 integrated into the semiconductor device 400 is embodied monolithically with the power semiconductor chip 20 (this is illustrated by the dashed line in FIG. 4A).

In accordance with one example, the power semiconductor chip 20 can be a p-channel MOSFET. In accordance with another example, the power semiconductor chip 20 can be an n-channel MOSFET.

FIG. 4B shows a semiconductor device 410 in which the semiconductor voltage measuring unit 70 comprises a dedicated semiconductor chip arranged laterally next to the power semiconductor chip 20 on the chip pad 30. The semiconductor voltage measuring unit 70 can be secured to the chip pad 30 e.g. by means of a solder connection or by means of an adhesive, for instance by means of a non-conductive adhesive.

FIG. 4C shows a semiconductor device 420 in which the semiconductor voltage measuring unit 70 is arranged on the upper main surface of the power semiconductor chip 20 (chip-on-chip). The semiconductor voltage measuring unit 70 can be secured to the upper main surface of the power semiconductor chip 20 e.g. by means of a solder connection or by means of an adhesive, for instance by means of a non-conductive adhesive.

FIGS. 1, 3A to 3C and 4A to 4C show semiconductor devices in which the clip 10 and the electrical connector 60 are not embodied integrally with the respective external terminal 50. However, it is also possible for the clip 10, the contact finger 14 or respectively the contact fingers 14, 15 and/or the electrical connector 60 to be embodied integrally with the respective external terminal 50. In other words, the clip 10, the respective contact finger 14 or 14, 15 and/or the electrical connector 60 can itself form the respective external terminal 50.

Figure 5:
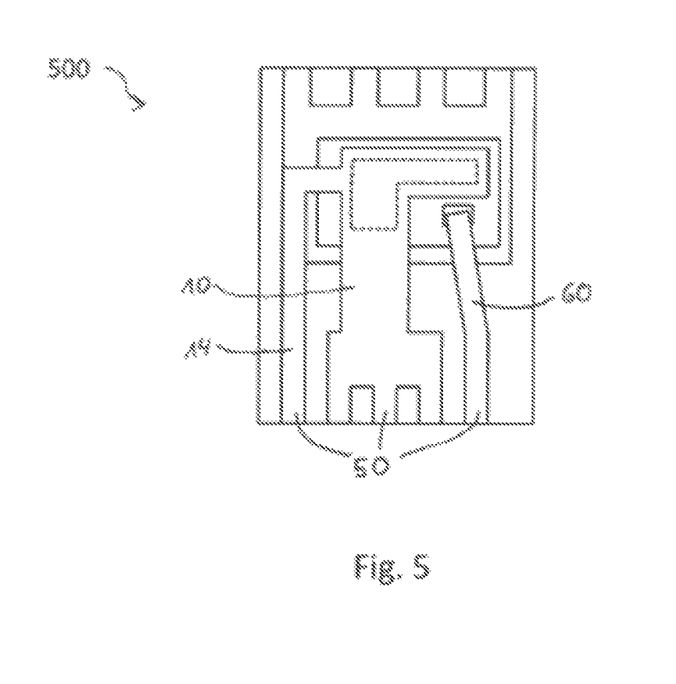
FIG. 5 shows a schematic plan view of a further semiconductor device in accordance with the disclosure, in which the integrated shunt resistor is embodied integrally with external terminals of the semiconductor device.

FIG. 5 shows a semiconductor device 500 in which the clip 10 and the contact finger 14 are embodied integrally with the respective external terminal 50. Furthermore, the electrical connector 60 is configured as a further clip, which likewise itself forms an external terminal 50.

In accordance with one example, a method for producing a semiconductor device can comprise applying the clip 10 and/or the electrical connector 60 embodied as a further clip on the power semiconductor chip 20 by means of a pick and place process.

In accordance with another example, a method for producing a semiconductor device can comprise the chip pad 20 being part of a first (lower) leadframe and the clip 10 and/or the electrical connector 60 embodied as a further clip being part of a second (upper) leadframe. The upper leadframe can be arranged on the upper main surface of the power semiconductor chip 20 and the clip 10 and/or the electrical connector 60 can be singulated from the upper leadframe.

Such a manner of construction using a first (lower) leadframe and a further upper leadframe (comprising the clip 10 with integral contact finger 14 or respectively integral contact fingers 14, 15 and e.g. the electrical connector 60) can be used in all of the semiconductor devices described here, i.e. in particular also in the semiconductor devices in which the external terminals 50 are realized partly or completely by the lower leadframe (see FIGS. 1 and 3A to 4C).

In the semiconductor devices in FIGS. 1 and 3A to 5, the clip 10 is configured for electrically connecting the first power electrode of the power semiconductor chip 20 to an external terminal 50. However, it is also possible for the clip 10 to provide an internal electrical connection in the semiconductor device.

Figure 6:
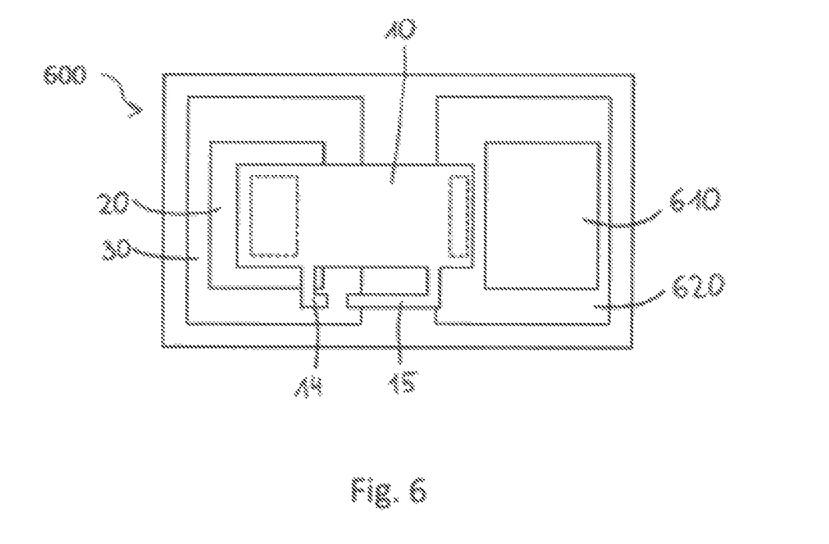
FIG. 6 shows a schematic plan view of a further semiconductor device in accordance with the disclosure, in which the clip forming the integrated shunt resistor is used for providing a half-bridge circuit.

FIG. 6 shows a semiconductor device 600 comprising a first power semiconductor chip 20 and a second power semiconductor chip 610, wherein the first power semiconductor chip 20 is arranged on and electrically connected to a first chip pad 30 and the second power semiconductor chip 610 is arranged on and electrically connected to a second chip pad 620. The clip 10 connects the first power electrode of the first power semiconductor chip 20 (internally) to the second chip pad 620 in a half-bridge circuit.

In accordance with one example, one of the power semiconductor chips 20, 610 can be an n-channel MOSFET and the other of the power semiconductor chips 20, 610 can be a p-channel MOSFET. The first chip pad 30 and the second chip pad 620 can be referred to as a "splitted" leadframe.

In accordance with one example, the contact fingers 14, 15 are connected to an internal semiconductor voltage measuring unit (not shown in FIG. 6). In accordance with another example, the contact fingers 14, 15 are connected to external terminals (not shown in FIG. 6) of the semiconductor device 600.

The semiconductor device 600 can likewise be constructed using a first (lower) leadframe and a further upper leadframe (comprising the clip 10 with integral contact finger 14 or respectively integral contact fingers 14, 15 and e.g. one or a plurality of electrical connectors (not shown in FIG. 6) for contacting the control electrode(s) of the first power semiconductor chip 20 and, if appropriate, of the second power semiconductor chip 610).

In all of the semiconductor devices, the integral part 11 of the clip 10 forming the shunt resistor can have a particular shaping. By way of example, the integral part 11 can be embodied, in a lateral dimension, as narrower and/or with a smaller thickness than the first and/or second contact area 12, 13 of the clip 10 in order to reduce the cross-sectional area of the clip 10 in the integral part 11 and thereby to increase the voltage drop between the contact fingers 14, 15.

Figure 7:
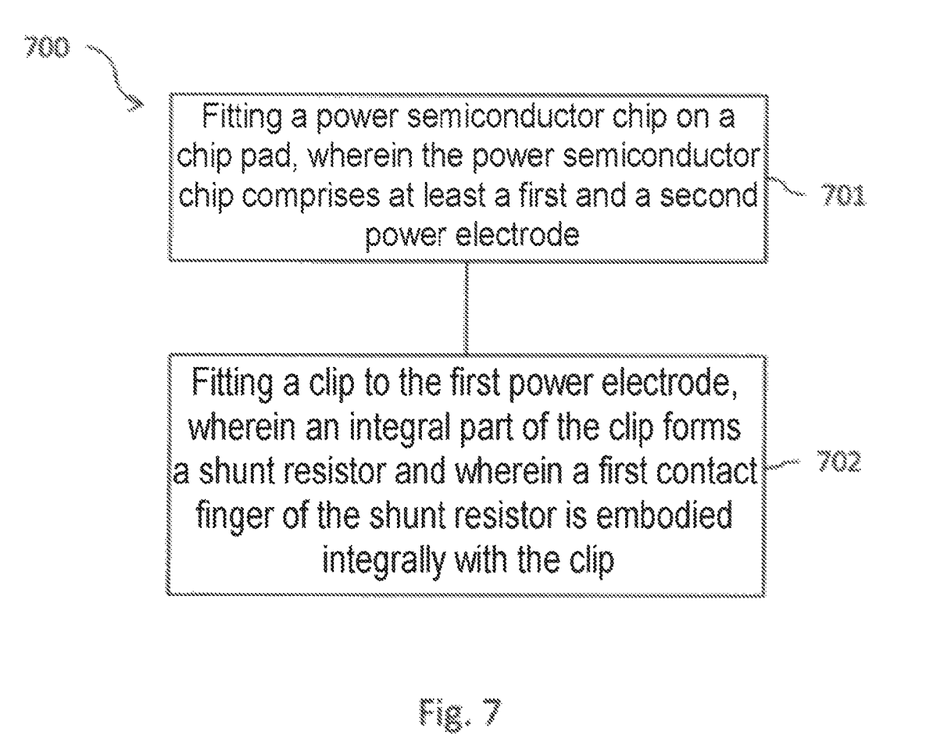
FIG. 7 shows an exemplary flow diagram of a method for producing a semiconductor device with integrated shunt resistor.

FIG. 7 shows a method 700 for producing a semiconductor device. The method 700 comprises, in 701, fitting a power semiconductor chip on a chip pad, wherein the power semiconductor chip comprises at least a first and a second power electrode. The method 700 comprises, in 702, fitting a clip to the first power electrode, wherein an integral part of the clip forms a shunt resistor and wherein a first contact finger of the shunt resistor is embodied integrally with the clip.

In accordance with one example, the chip pad can be part of a lower leadframe and the clip can be part of an upper leadframe. Furthermore, the method 700 can comprise fitting a second clip to a control electrode of the power semiconductor chip, wherein the second clip is part of the upper leadframe.

EXAMPLES

The semiconductor device and the method for producing a semiconductor device are explained in greater detail below on the basis of examples.

Example 1 is a semiconductor device, comprising a first chip pad, a power semiconductor chip arranged on the first chip pad and comprising at least a first and a second power electrode, and a clip connected to the first power electrode, wherein an integral part of the clip forms a shunt resistor, and wherein a first contact finger of the shunt resistor is embodied integrally with the clip.

Example 2 is a semiconductor device according to Example 1, wherein a second contact finger of the shunt resistor is embodied integrally with the clip.

Example 3 is a semiconductor device according to Example 1 or 2, wherein a distal end of the first contact finger is connected to or forms a first external terminal of the semiconductor device.

Example 4 is a semiconductor device according to Example 2, wherein a distal end of the second contact finger is connected to or forms a second external terminal of the semiconductor device.

Example 5 is a semiconductor device according to Example 1, wherein a distal end of the first contact finger is connected to a first measurement electrode of a semiconductor voltage measuring unit arranged in the semiconductor device.

Example 6 is a semiconductor device according to Example 2, wherein a distal end of the second contact finger is connected to a second measurement electrode of a semiconductor voltage measuring unit arranged in the semiconductor device.

Example 7 is a semiconductor device according to Example 5 or 6, wherein the semiconductor voltage measuring unit is embodied monolithically with the power semiconductor chip.

Example 8 is a semiconductor device according to Example 5 or 6, wherein the semiconductor voltage measuring unit comprises a semiconductor chip arranged on a main surface of the power semiconductor chip.

Example 9 is a semiconductor device according to Example 5 or 6, wherein the semiconductor voltage measuring unit comprises a semiconductor chip arranged laterally next to the power semiconductor chip.

Example 10 is a semiconductor device according to Example 1, wherein a distal end of the clip is connected to or forms an external terminal of the semiconductor device.

Example 11 is a semiconductor device according to Example 10, wherein the external terminal forms a common power terminal of the power semiconductor chip and measurement terminal for measuring a voltage drop across the shunt resistor.

Example 12 is a semiconductor device according to Example 1, furthermore comprising a second power semiconductor chip arranged on a second chip pad separated from the first chip pad.

Example 13 is a semiconductor device according to Example 12, wherein the clip electrically connects the first power electrode of the first power semiconductor chip to the second chip pad.

Example 14 is a method for producing a semiconductor device, the method comprising fitting a power semiconductor chip on a chip pad, wherein the power semiconductor chip comprises at least a first and a second power electrode, and fitting a clip to the first power electrode, wherein an integral part of the clip forms a shunt resistor and wherein a first contact finger of the shunt resistor is embodied integrally with the clip.

Example 15 is a method according to Example 14, wherein a second contact finger of the shunt resistor is embodied integrally with the clip.

Example 16 is a method according to Example 14 or 15, furthermore comprising providing a semiconductor voltage measuring unit in the semiconductor device, and fitting the first contact finger to a measurement terminal of the semiconductor voltage measuring unit.

Example 17 is a method according to Examples 15 and 16, furthermore comprising fitting the second contact finger to a further measurement terminal of the semiconductor voltage measuring unit.

Example 18 is a method according to Example 14 or 15, furthermore comprising fitting the first contact finger to an external terminal of the semiconductor device.

Example 19 is a method according to any of Examples 14 to 18, wherein the chip pad is part of a lower leadframe and the clip is part of an upper leadframe.

Example 20 is a method according to Example 19, furthermore comprising fitting a second clip to a control electrode of the power semiconductor chip, wherein the second clip is part of the upper leadframe.

LIST OF REFERENCE SIGNS 9A first power electrode
9B second power electrode
10 clip
11 integral part of the clip
12 first contact area
13 second contact area
14 first contact finger
15 second contact finger
20 power semiconductor chip
21 control electrode
30 chip pad
40 encapsulation
50 external terminals
50.1 external terminal
50.2 external terminal
50.3 external terminal
50.4 external terminal
60 electrical connector
70 semiconductor voltage measuring unit
100 semiconductor device
200 circuit diagram
210 transistor
220 shunt resistor
221 measurement contact
222 measurement contact
230 power contact
300 semiconductor device
310 semiconductor device
320 semiconductor device
400 semiconductor device
410 semiconductor device
420 semiconductor device
500 semiconductor device
600 semiconductor device
610 second power semiconductor chip
620 second chip pad 700 method for producing a semiconductor device
701 fitting a power semiconductor chip
702 fitting a clip

The invention claimed is:

1. A semiconductor device, comprising:
   a first chip pad;
   a power semiconductor chip arranged on the first chip pad and comprising at least a first and a second power electrode; and
   a clip connected to the first power electrode;
   wherein an integral part of the clip forms a shunt resistor; and
   wherein a first contact finger of the shunt resistor is embodied integrally with the clip.

2. The semiconductor device according to claim 1, wherein a second contact finger of the shunt resistor is embodied integrally with the clip.

3. The semiconductor device according to claim 1, wherein a distal end of the first contact finger is connected to or forms a first external terminal of the semiconductor device.

4. The semiconductor device according to claim 2, wherein a distal end of the second contact finger is connected to or forms a second external terminal of the semiconductor device.

5. The semiconductor device according to claim 1, wherein a distal end of the first contact finger is connected to a first measurement electrode of a semiconductor voltage measuring unit arranged in the semiconductor device.

6. The semiconductor device according to claim 2, wherein a distal end of the second contact finger is connected to a second measurement electrode of a semiconductor voltage measuring unit arranged in the semiconductor device.

7. The semiconductor device according to claim 5, wherein the semiconductor voltage measuring unit is embodied monolithically with the power semiconductor chip.

8. The semiconductor device according to claim 5, wherein the semiconductor voltage measuring unit comprises a semiconductor chip arranged on a main surface of the power semiconductor chip.

9. The semiconductor device according to claim 5, wherein the semiconductor voltage measuring unit comprises a semiconductor chip arranged laterally next to the power semiconductor chip.

10. The semiconductor device according to claim 1, wherein a distal end of the clip is connected to or forms an external terminal of the semiconductor device.

11. The semiconductor device according to claim 10, wherein the external terminal forms a common power terminal of the power semiconductor chip and measurement terminal for measuring a voltage drop across the shunt resistor.

12. The semiconductor device according to claim 1, further comprising:
    a second power semiconductor chip arranged on a second chip pad separated from the first chip pad.

13. The semiconductor device according to claim 12, wherein the clip electrically connects the first power electrode of the first power semiconductor chip to the second chip pad.

* * * * *